United States Patent
Lei et al.

(10) Patent No.: US 8,975,162 B2
(45) Date of Patent: Mar. 10, 2015

(54) WAFER DICING FROM WAFER BACKSIDE

(71) Applicant: Applied Materials, Inc., Santa Clara, CA (US)

(72) Inventors: Wei-Sheng Lei, San Jose, CA (US); Brad Eaton, Menlo Park, CA (US); Aparna Iyer, Sunnyvale, CA (US); Saravjeet Singh, Santa Clara, CA (US); Madhava Rao Yalamanchili, Morgan Hill, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/095,824

(22) Filed: Dec. 3, 2013

(65) Prior Publication Data

US 2014/0179084 A1 Jun. 26, 2014

Related U.S. Application Data (60) Provisional application No. 61/740,301, filed on Dec. 20, 2012.

(51) Int. Cl.
*H01L 21/00* (2006.01)
*H01L 21/822* (2006.01)
(Continued)

(52) U.S. Cl.
CPC .............. *H01L 21/822* (2013.01); *H01L 21/78* (2013.01); *H01L 21/3081* (2013.01); *H01L 21/6836* (2013.01); *H01L 2221/68327* (2013.01); *H01L 2221/6834* (2013.01)
USPC ....................................................... 438/463

(58) Field of Classification Search
CPC .............. H01L 21/822; H01L 21/6836; H01L 21/3081; H01L 21/78
USPC ....................................................... 438/463
See application file for complete search history.

(56) References Cited

U.S. PATENT DOCUMENTS

| | | |
|---|---|---|
| 4,049,944 A | 9/1977 | Garvin et al. |
| 4,339,528 A | 7/1982 | Goldman |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

International Search Report and Written Opinion of the International Searching Authority dated Mar. 31, 2014, in International Patent Application No. PCT/US2013/075101.

(Continued)

*Primary Examiner* — William D Coleman
(74) *Attorney, Agent, or Firm* — Blakely Sokoloff Taylor Zafman LLP (57) ABSTRACT

Methods of dicing semiconductor wafers, each wafer having a plurality of integrated circuits, are described. For example, a method includes applying a protection tape to a wafer front side, the wafer having a dicing tape attached to the wafer backside. The dicing tape is removed from the wafer backside to expose a die attach film disposed between the wafer backside and the dicing tape. Alternatively, if no die attach film is initially disposed between the wafer backside and the dicing tape, a die attach film is applied to the wafer backside at this operation. A water soluble mask is applied to the wafer backside. Laser scribing is performed on the wafer backside to cut through the mask, the die attach film and the wafer, including all layers included within the front side and backside of the wafer. A plasma etch is performed to treat or clean surfaces of the wafer exposed by the laser scribing. A wafer backside cleaning is performed and a second dicing tape is applied to the wafer backside. The protection tape is the removed from the wafer front side.

20 Claims, 8 Drawing Sheets

(51) Int. Cl.
*H01L 21/78* (2006.01)
*H01L 21/308* (2006.01)
*H01L 21/683* (2006.01)

(56) References Cited

U.S. PATENT DOCUMENTS

| | | | |
|---|---|---|---|
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 8,652,940 B2 * | 2/2014 | Lei et al. ........................ 438/460 |
| 8,845,854 B2 * | 9/2014 | Lei et al. .................... 156/345.32 |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2006/0043535 A1 | 3/2006 | Hiatt |
| 2006/0086898 A1 | 4/2006 | Cheng et al. |
| 2006/0088984 A1 * | 4/2006 | Li et al. ........................ 438/463 |
| 2006/0146910 A1 | 7/2006 | Koochesfahani et al. |
| 2006/0205182 A1 | 9/2006 | Soejima |
| 2009/0255911 A1 | 10/2009 | Krishnaswami et al. |
| 2010/0013036 A1 | 1/2010 | Carey |
| 2010/0248451 A1 | 9/2010 | Pirogovsky et al. |
| 2011/0101505 A1 | 5/2011 | Co et al. |
| 2011/0147943 A1 | 6/2011 | McElrea et al. |
| 2011/0312157 A1 | 12/2011 | Lei et al. |
| 2013/0045554 A1 | 2/2013 | Yamazaki |
| 2013/0065378 A1 | 3/2013 | Johnson et al. |
| 2013/0230972 A1 | 9/2013 | Johnson et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| KR | 10-2002-0068608 | 8/2002 |
| KR | 10-2011-0017728 | 2/2011 |
| WO | WO-03071591 | 5/2003 |
| WO | WO-2011-066863 | 6/2011 |

OTHER PUBLICATIONS

Linder, V., et al., "Water-Soluble Sacrificial Layers for Surface Micromachining," www.small-journal.com, 2005, 1, No. 7, 7 pgs.
Singh, Saravjeet, at al., "Apparatus and Methods for Dry Etch With Edge, Side and Back Protection," U.S. Appl. No. 61/491,693, filed May 31, 2011 24 pgs.

* cited by examiner

WAFER DICING FROM WAFER BACKSIDE

CROSS-REFERENCE TO RELATED APPLICATIONS

This application claims the benefit of U.S. Provisional Application No. 61/740,301, filed on Dec. 20, 2012, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having a plurality of integrated circuits includes applying a protection tape to a wafer front side, the wafer having a dicing tape attached to the wafer backside. The dicing tape is removed from the wafer backside to expose a die attach film disposed between the wafer backside and the dicing tape. A water soluble mask is applied to the wafer backside. Laser scribing is performed on the wafer backside to cut through the mask, the die attach film and the wafer, including all layers included on the front side and backside of the wafer. A plasma etch is performed to treat or clean surfaces of the wafer exposed by the laser scribing. A wafer backside cleaning is performed and a second dicing tape is applied to the wafer backside. The protection tape is the removed from the wafer front side.

In another embodiment, a method of dicing a semiconductor wafer having a plurality of integrated circuits includes applying a protection tape to a wafer front side, the wafer having a dicing tape attached to the wafer backside. The dicing tape is removed from the wafer backside. A die attach film is then applied to the wafer backside. A water soluble mask is then applied to the wafer backside. Laser scribing is performed on the wafer backside to cut through the the mask, die attach film and the wafer, including all layers included on the front side and backside of the wafer. A plasma etch is performed to treat or clean surfaces of the wafer exposed by the laser scribe. A wafer backside cleaning is performed and a second dicing tape is applied to the wafer backside. The protection tape is the removed from the wafer front side.

In another embodiment, a method is provided for dicing a semiconductor wafer having a plurality of integrated circuits covered by a protection tape on a front side thereof and having metallization on a backside thereof. The method involves exposing a die attach film disposed on the semiconductor wafer backside. The method also involves applying a mask to the exposed die attach film on the semiconductor wafer backside. The method also involves laser scribing from the semiconductor wafer backside to cut through the mask, the die attach film, the metallization on the backside of the semiconductor wafer, the semiconductor wafer, and the integrated circuits on the front side of the semiconductor wafer. The method also involves plasma etching to treat or clean surfaces of the semiconductor wafer exposed by the laser scribing. The method also involves applying a dicing tape to the laser scribed semiconductor wafer backside.

DETAILED DESCRIPTION

Methods of dicing semiconductor wafers, each wafer having a plurality of integrated circuits thereon, are described. In the following description, numerous specific details are set forth, such as femtosecond-based laser scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma treatment may be implemented for die singulation. The laser scribe process may be used to cleanly remove a mask layer, organic and inorganic dielectric layers, and device layers on both sides of a wafer, as well as cut through an intervening substrate. The plasma etch or treatment portion of the dicing process may then be employed to yield clean die or chip singulation or dicing.

More specifically, one or more embodiments are directed to wafer or substrate dicing from the wafer or substrate backside. Particular embodiments include one of more of wafer dicing, backside dicing, backside metal/dielectric structures, picosecond-UV laser scribing, infrared femtosecond laser scribing, full thickness laser cutting, and the use of a water soluble mask. Approaches described herein may have implications for general laser scribing plus plasma etch hybrid processes used to singulate integrated circuit (IC) chips or dies from wafers or substrates. Other potential applications include MEMS wafer dicing. Approaches herein may be in contrast to femtosecond laser scribing plus plasma etch hybrid processing that involve use of a femtosecond laser to cleanly remove a mask layer, organic and inorganic dielectric layers and device layers, followed by plasma etch through a silicon layer (e.g., wafer or substrate) to realize chip singulation or dicing. Instead one or more embodiments involve continued scribing by the laser process through the wafer or substrate (e.g., from the backside), followed by a touch up or cleaning silicon etch process.

More generally, some wafers or substrates bear metal and/or dielectric layers on the wafer or substrate backside. Additionally, a die attach film is often added on wafer backside and is subjected to the dicing process along with the wafer or substrate, e.g., the die attach film is cut or patterned in the dicing process. In a conventional laser plus etch dicing process, an additional laser scribing operation is otherwise needed post plasma etch to remove such backside non-silicon layers. The additional laser operation may involve time consuming realignment of wafers. Furthermore, laser scribing and plasma etching from the wafer or substrate front side can demand use of a thick mask layer on the wafer or substrate front side to sufficiently protect metal bumps and pillars. There is also the potential to oxidize bumps and contaminate a device side of the wafer or substrate since the front side is exposed to, or at least facing the plasma during etching. As such, if additional backside non-silicon layers become a significant portion of the structure requiring singulation, dicing from front side may cause throughput and quality issues.

Figure 1:
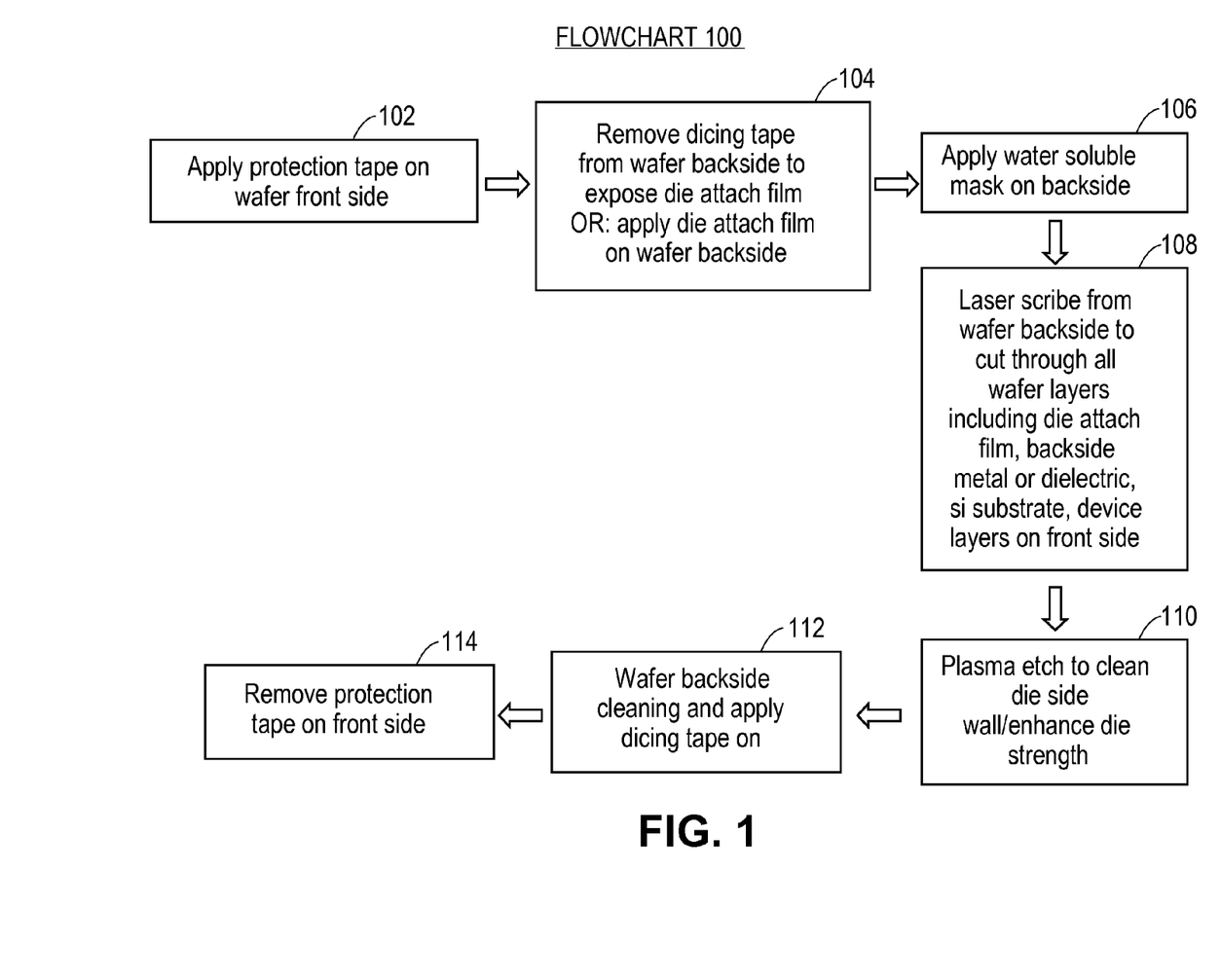
FIG. 1 is a flowchart including operations for a backside laser plus plasma etch dicing process, in accordance with an embodiment of the present invention.

Accordingly, as described in greater detail below, one or more embodiments involve dicing from a wafer or substrate backside. As an example, FIG. 1 is a flowchart 100 including operations for a backside laser plus plasma etch dicing process, in accordance with an embodiment of the present invention. Referring to flowchart 100, at operation 102, a protection tape is applied to a wafer front side, the wafer having a dicing tape attached to the wafer backside. At operation 104, the dicing tape is removed from the wafer backside to expose a die attach film disposed between the wafer backside and the dicing tape. Alternatively, if no die attach film is initially disposed between the wafer backside and the dicing tape, a die attach film is applied to the wafer backside at this operation. At operation 106, a water soluble mask is applied to the wafer backside, e.g., on the die attach film. At operation 108, a laser scribe is performed on the wafer backside to cut through the die attach film and the wafer, including all layers on the front side and backside of the wafer (such as backside and font side metal or dielectric layers and/or device layers). At operation 110, a plasma etch is performed to treat or clean surfaces of the wafer exposed by the laser scribe (e.g., silicon sidewalls exposed by the laser scribe). The etch process may be used to clean debris and/or enhance die strength. At operation 112, a wafer backside cleaning is performed and a second dicing tape is applied to the wafer backside. At operation 114, the protection tape is removed from the wafer front side.

Figure 2A:
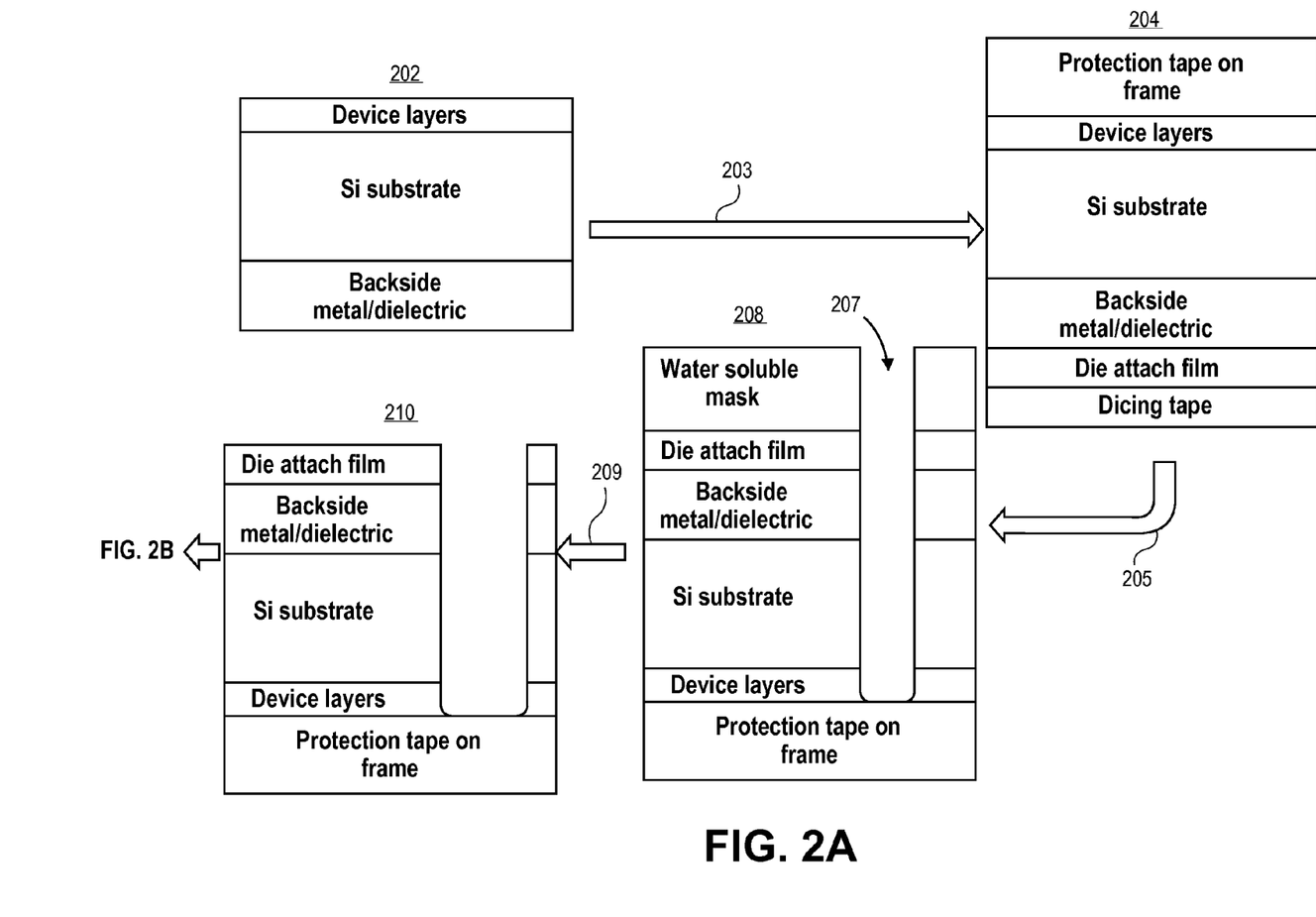
FIGS. 2A and 2B illustrate cross-sectional views representing various operations in a backside laser plus plasma etch dicing process, in accordance with an embodiment of the present invention.
Figure 2B:
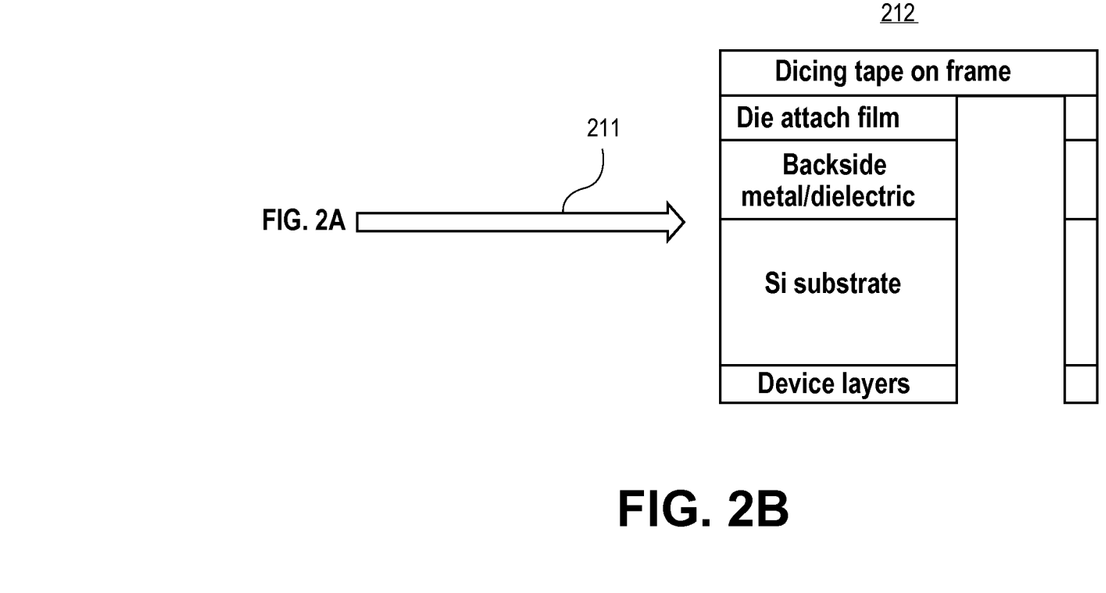

As a structural example, FIGS. 2A and 2B illustrate cross-sectional views representing various operations in a backside laser plus plasma etch dicing process, in accordance with an embodiment of the present invention.

Referring to FIG. 2A, structure 202 includes a silicon substrate having device layers disposed on the front side of the substrate and metal and/or dielectric layers disposed on the backside of the substrate. At operation 203, as depicted by the resulting structure 204, a protection tape is mounted on the wafer front side, e.g., on the device layers. The substrate is mounted on a frame via the protection tape. Also, a die attach film and a dicing tape are disposed on the backside of the substrate, e.g., on the metal and/or dielectric layers disposed on the backside of the substrate. At operation 205, as depicted by the resulting structure 208, a water soluble mask is disposed on the die attach film of the backside of the substrate. At operation 207, as is also depicted by the resulting structure 208, from the backside of the substrate, a laser scribing process is performed through the water soluble mask, the die attach film, the metal and/or dielectric layers, the silicon substrate, and the device layers. The laser scribing process stops on or into the protection tape on the front side of the substrate. Additionally, at operation 207, a plasma etch process is used to clean exposed sidewalls of the silicon substrate. Additionally, the plasma etch process can be used to remove a certain amount of the silicon from the sidewalls for die strength enhancement. At operation 209, the water soluble mask is removed, e.g., by an aqueous based cleaning process, to provide structure 210. Then, referring to FIG. 2B, at operation 211, as depicted by the resulting structure 212, a dicing tape is applied to the backside of the substrate, e.g., on the scribed die attach film. Then, the protection tape (and corresponding frame) is removed from the diced substrate front side. The result is a plurality of chips or dies singulated from the silicon substrate. The dies or chips are held in place by the dicing tape for transport, e.g., on a second frame.

Embodiments described herein can include one or more of the following advantages of dicing from the backside of a wafer or substrate: (1) since bumps are not involved in the backside metallization, mask thickness (e.g., water soluble mask thickness) can be much thinner than otherwise required for a front side process. As such, less time is needed for opening the mask, compensating for any additional time required for cutting through the whole wafer with a laser scribing process. Also, a cost savings can be realized by using less mask material. Furthermore, time duration for mask coating and baking can be reduced, e.g., as compared to a thick mask coating process where multiple layer coatings may be involved. Use of a thin mask coating can also translate to improved coating quality versus a thick mask which can have air bubbles trapped therein causing etch defects in the wafer. (2) Use of a plasma etch to repair the diced sidewalls involves significantly less silicon etch away, and significantly reduced etch time. (3) Dicing from backside will not substantially impact throughput since the process is a laser cut plus plasma versus a scribe front side, then etch, then scribe backside process. (4) A significant reduction in opportunities for bump oxidization and device side contamination may be realized since the front side is untouched and can be placed on a cooling chuck. (5) Specification for laser performance may be relaxed such that longer wavelength and/or longer pulsewidth lasers may be used. This can reduce laser cost by widening laser source options. Potential suitable laser sources include picosecond-UV lasers, infrared femtosecond-lasers (e.g., instead of SHG (~500 nm)-femtosecond lasers, which are the preferred laser sources for front side dicing). More flexibility may be realized since backside laser cutting involves laser first removal of silicon which has good absorption to photons at wide wavelength/pulse width before it touches device layers.

Thus, in accordance with an embodiment of the present invention, a combination of backside picosecond- or femtosecond-based laser scribing and plasma etching is used to dice a semiconductor wafer into individualized or singulated integrated circuits. In one embodiment, backside picosecond- or femtosecond-based laser scribing is used as an essentially, if not totally, non-thermal process. For example, the backside picosecond- or femtosecond-based laser scribing may be localized with no or negligible heat damage zone. In an embodiment, approaches herein are used to singulated integrated circuits having ultra-low k films, and wafers having metallization on both the front and back surfaces. With convention dicing, saws may need to be slowed down to accommodate such low k films.

In accordance with an embodiment of the present invention, a water soluble mask is used in a backside laser scribing and etch process. In an embodiment, the water soluble mask is a film that is readily dissolvable in an aqueous media. For example, in one embodiment, the water soluble mask is composed of a material that is soluble in one or more of an alkaline solution, an acidic solution, or in deionized water. In one embodiment, the water soluble mask has a thickness approximately in the range of 5-60 microns. In a specific embodiment, the water soluble mask has a thickness of approximately 20 microns. In an embodiment, the water soluble mask maintains its water solubility upon a heating process, such as heating approximately in the range of 50-160 degrees Celsius. For example, in one embodiment, the water soluble mask is soluble in aqueous solutions following exposure to chamber conditions used in a laser and plasma etch singulation process. In one embodiment, the water soluble mask is composed of a material such as, but not limited to, polyvinyl alcohol, polyacrylic acid, dextran, polymethacrylic acid, polyethylene imine, or polyethylene oxide. In a specific embodiment, the water soluble mask has an etch rate in an aqueous solution approximately in the range of 1-15 microns per minute and, more particularly, approximately 1.3 microns per minute. In another specific embodiment, the water soluble mask is formed by a spin-on technique.

In an embodiment, the semiconductor wafer or substrate that is scribed is composed of a material suitable to withstand a fabrication process and upon which semiconductor processing layers may suitably be disposed. For example, in one embodiment, the semiconductor wafer or substrate is composed of a group IV-based material such as, but not limited to, crystalline silicon, germanium or silicon/germanium. In a specific embodiment, providing the semiconductor wafer includes providing a monocrystalline silicon substrate. In a particular embodiment, the monocrystalline silicon substrate is doped with impurity atoms. In another embodiment, the semiconductor wafer or substrate is composed of a III-V material such as, e.g., a III-V material substrate used in the fabrication of light emitting diodes (LEDs).

In an embodiment, the semiconductor wafer or substrate has disposed on its front side an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. One or more of the dielectric layers can be a low-k dielectric layer. In one embodiment, the semiconductor wafer or substrate has disposed metallization layers (and corresponding dielectric layers) on the backside of the wafer or substrate. More generally, many functional layers of different material types (e.g., conductors, insulators, semiconductors) and thicknesses can be disposed on both the backside and the front side of the substrate. Such materials may include, but are not limited to, organic materials such as polymers, metals, or inorganic dielectrics such as silicon dioxide and silicon nitride. A low K dielectric layer may also be included (e.g., a layer having a dielectric constant of less than the dielectric constant of 4.0 for silicon dioxide). In a specific embodiment, the low K dielectric layers are composed of a carbon-doped silicon oxide material.

In an embodiment, the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as low-k dielectric layers and backside metallization layers.

Figure 3:
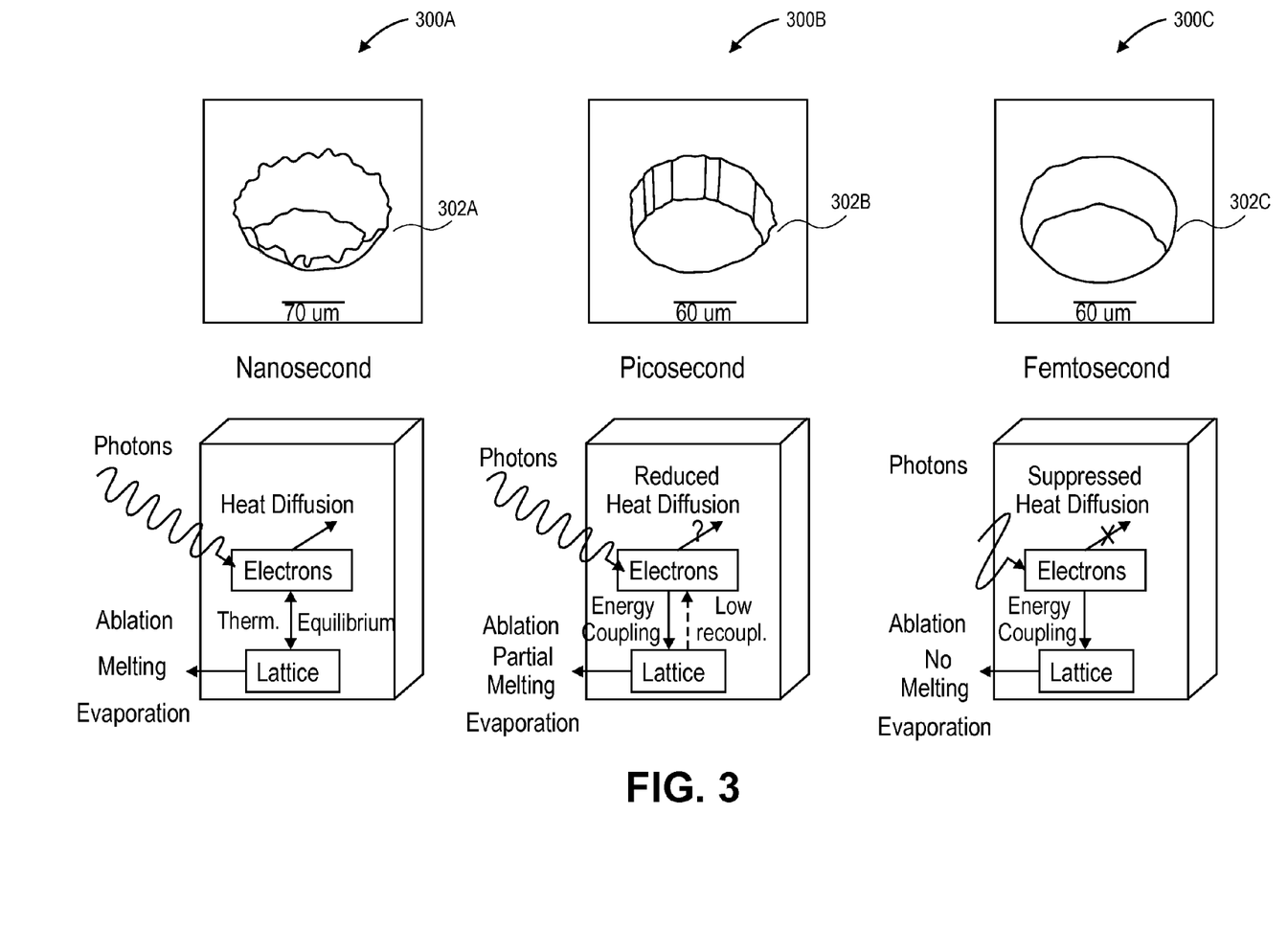
FIG. 3 illustrates the effects of using a laser pulse in the femtosecond range versus longer pulse times, in accordance with an embodiment of the present invention.

FIG. 3 illustrates the effects of using a laser pulse in the femtosecond range versus longer frequencies, in accordance with an embodiment of the present invention. Referring to FIG. 3, by using a laser with a pulse width in the femtosecond range heat damage issues are mitigated or eliminated (e.g., minimal to no damage 302C with femtosecond processing of a via 300C) versus longer pulse widths (e.g., damage 302B with picosecond processing of a via 300B and significant damage 302A with nanosecond processing of a via 300A). The elimination or mitigation of damage during formation of via 300C may be due to a lack of low energy recoupling (as is seen for picosecond-based laser ablation) or thermal equilibrium (as is seen for nanosecond-based laser ablation), as depicted in FIG. 3. However, as mentioned above, picosecond- or femtosecond-based may be used for embodiments herein since parameters may be relaxed during a backside laser scribing process, as opposed to a front side laser scribing process.

As mentioned above, in an embodiment, etching the semiconductor wafer or substrate includes using a plasma etching process. In one embodiment, an ultra-high-density plasma source is used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of treating and/or etching silicon may be used. In a specific embodiment, the etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate.

In another embodiment, a plurality of integrated circuits may be separated by streets having a width of approximately 10 microns or smaller. The use of a backside picosecond- or femtosecond-based laser scribing approach, at least in part due to the tight profile control of the laser, may enable such compaction in a layout of integrated circuits. For example, FIG. 4 illustrates compaction on a semiconductor wafer or substrate achieved by using narrower streets versus conventional dicing which may be limited to a minimum width, in accordance with an embodiment of the present invention.

Figure 4:
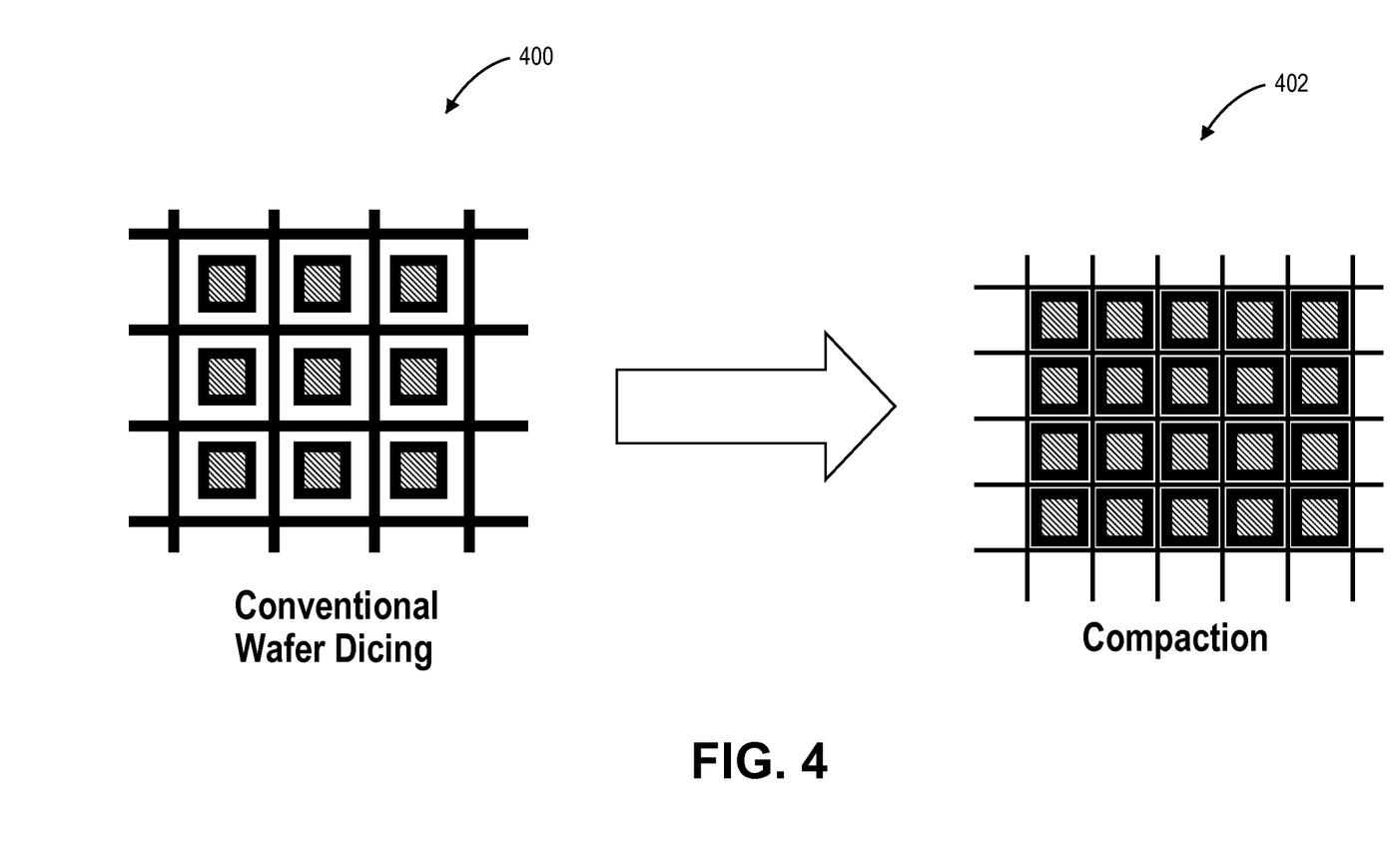
FIG. 4 illustrates compaction on a semiconductor wafer achieved by using narrower streets versus conventional dicing which may be limited to a minimum width, in accordance with an embodiment of the present invention.

Referring to FIG. 4, compaction on a semiconductor wafer is achieved by using narrower streets (e.g., widths of approximately 10 microns or smaller in layout 402) versus conventional dicing which may be limited to a minimum width (e.g., widths of approximately 70 microns or larger in layout 400). It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits.

Figure 5:
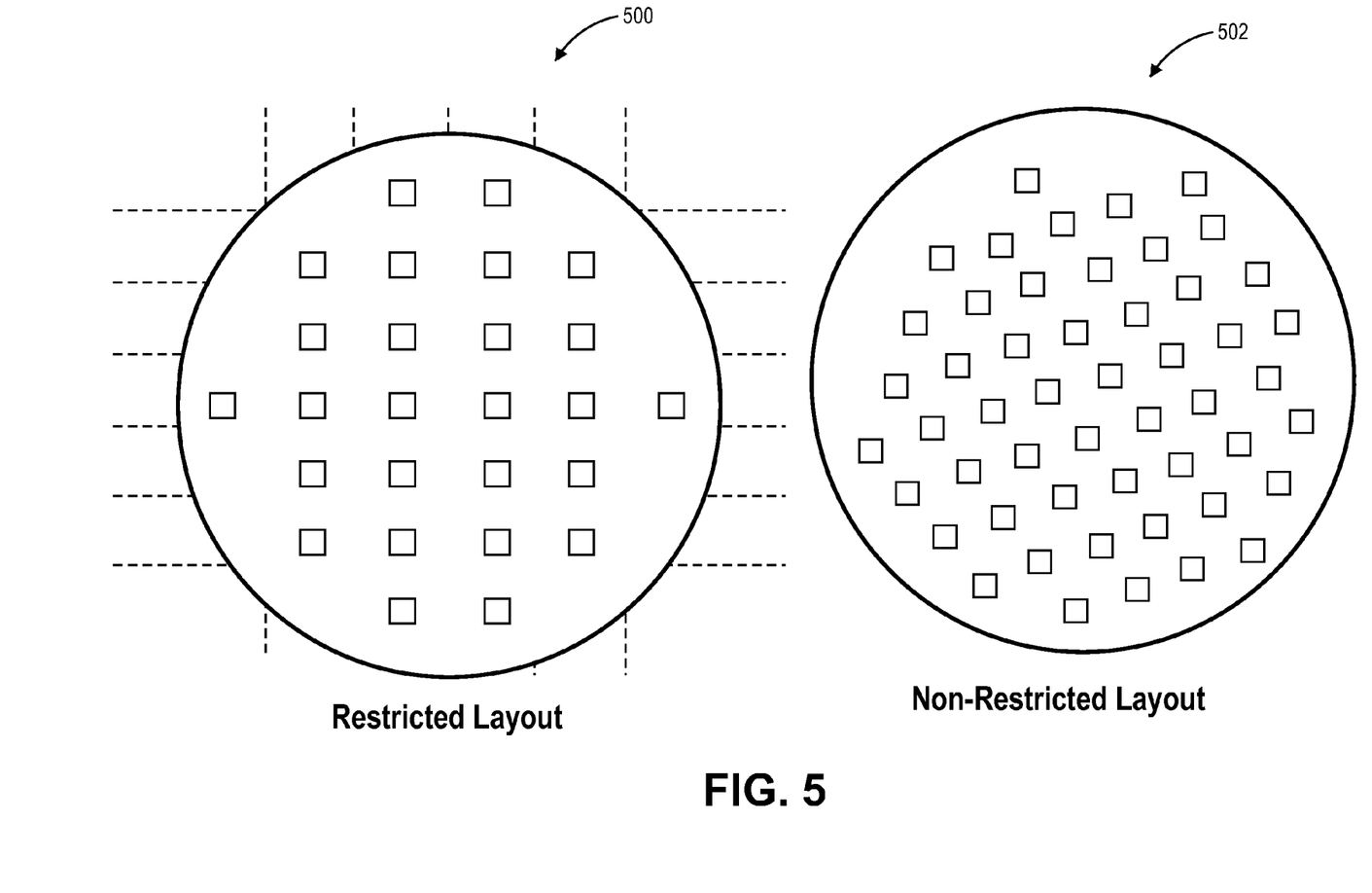
FIG. 5 illustrates freeform integrated circuit arrangement allowing denser packing and, hence, more die per wafer versus grid alignment approaches, in accordance with an embodiment of the present invention.

In another embodiment, a plurality of integrated circuits may be arranged on a semiconductor wafer or substrate in a non-restricted layout. For example, FIG. 5 illustrates freeform integrated circuit arrangement allowing denser packing. The denser packing may provide for more die per wafer versus grid alignment approaches, in accordance with an embodiment of the present invention. Referring to FIG. 5, a freeform layout (e.g., a non-restricted layout on semiconductor wafer or substrate 502) allows denser packing and hence more die per wafer versus grid alignment approaches (e.g., a restricted layout on semiconductor wafer or substrate 500). In an embodiment, the speed of the laser ablation and plasma etch singulation process is independent of die size, layout or the number of streets.

A single process tool may be configured to perform many or all of the operations in a backside picosecond- or femtosecond-based laser ablation and plasma etch singulation process. For example, FIG. 6 illustrates a block diagram of a tool layout for laser and plasma dicing of wafers or substrates, in accordance with an embodiment of the present invention.

Figure 6:
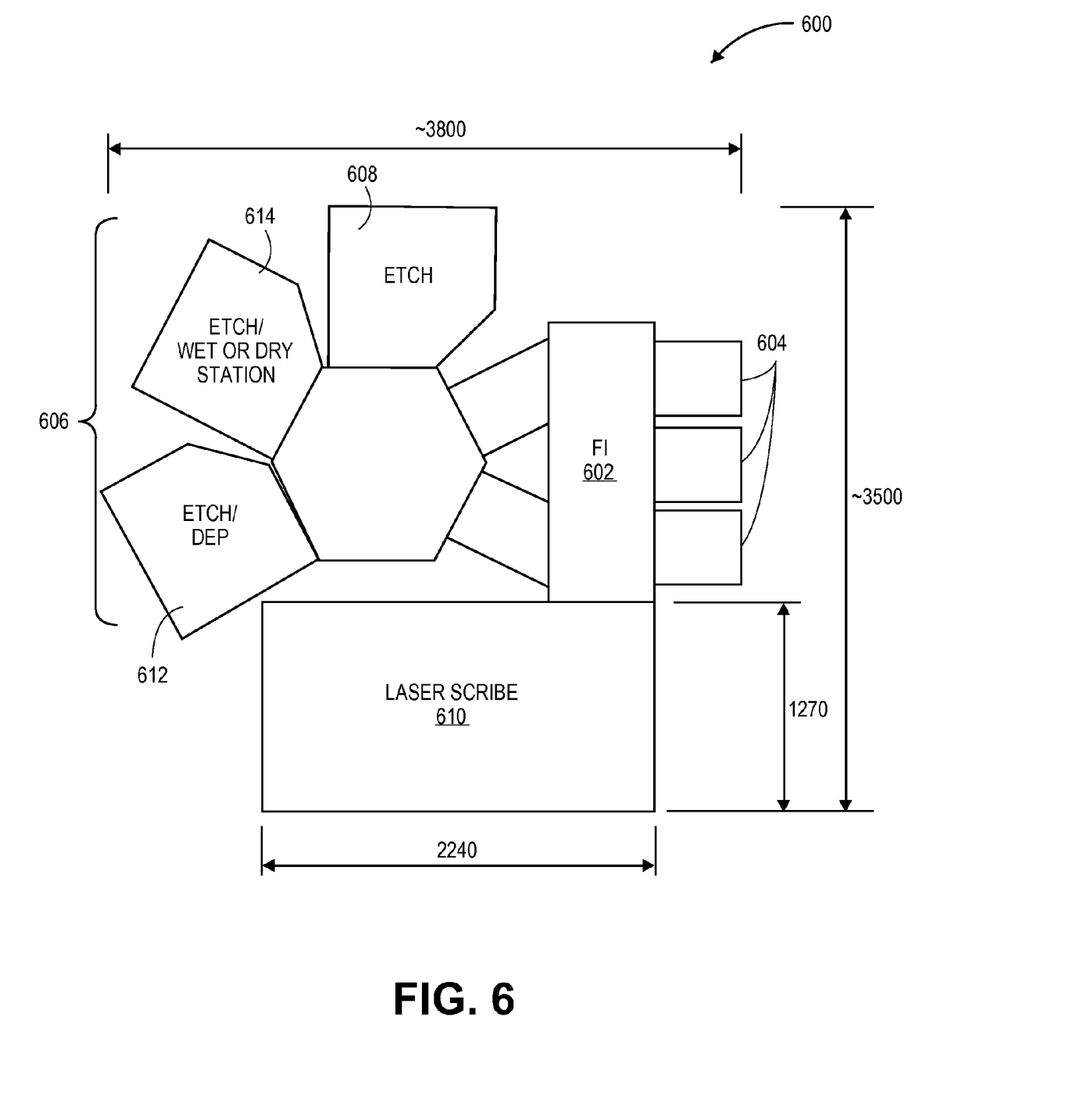
FIG. 6 illustrates a block diagram of a tool layout for laser and plasma dicing of wafers or substrates, in accordance with an embodiment of the present invention.

Referring to FIG. 6, a process tool 600 includes a factory interface 602 (FI) having a plurality of load locks 604 coupled therewith. A cluster tool 606 is coupled with the factory interface 602. The cluster tool 606 includes one or more plasma etch chambers, such as plasma etch chamber 608. A laser scribe apparatus 610 is also coupled to the factory interface 602. The overall footprint of the process tool 600 may be, in one embodiment, approximately 3500 millimeters (3.5 meters) by approximately 3800 millimeters (3.8 meters), as depicted in FIG. 6.

In an embodiment, the laser scribe apparatus 610 houses a picosecond- or femtosecond-based laser. The picosecond- or femtosecond-based laser is suitable for performing a backside laser ablation portion of a laser and etch singulation process, such as the laser abalation processes described above. In one embodiment, a moveable stage is also included in laser scribe apparatus 600, the moveable stage configured for moving a wafer or substrate (or a carrier thereof) relative to the picosecond- or femtosecond-based laser. In a specific embodiment, picosecond- or femtosecond-based laser is also moveable. The overall footprint of the laser scribe apparatus 610 may be, in one embodiment, approximately 2240 millimeters by approximately 1270 millimeters, as depicted in FIG. 6.

In an embodiment, the one or more plasma etch chambers 608 is an Applied Centura® Silvia™ Etch system, available from Applied Materials of Sunnyvale, Calif., USA. The etch chamber may be specifically designed for a silicon etch or treatment used in a process to create singulate integrated circuits housed on or in single crystalline silicon substrates or wafers. In an embodiment, a high-density plasma source is included in the plasma etch chamber 608 to facilitate high silicon etch rates. In an embodiment, more than one etch chamber is included in the cluster tool 606 portion of process tool 600 to enable high manufacturing throughput of the singulation or dicing process.

The factory interface 602 may be a suitable atmospheric port to interface between an outside manufacturing facility with laser scribe apparatus 610 and cluster tool 606. The factory interface 602 may include robots with arms or blades for transferring wafers (or carriers thereof) from storage units (such as front opening unified pods) into either cluster tool 606 or laser scribe apparatus 610, or both.

Cluster tool 606 may include other chambers suitable for performing functions in a method of singulation. For example, in one embodiment, in place of an additional etch chamber, a deposition chamber 612 is included. The deposition chamber 612 may be configured for mask deposition on or above a backside of a wafer or substrate prior to laser scribing of the wafer or substrate. In one such embodiment, the deposition chamber 612 is suitable for depositing a water soluble mask layer. In another embodiment, in place of an additional etch chamber, a wet/dry station 614 is included. The wet/dry station may be suitable for cleaning residues and fragments, or for removing a water soluble mask, subsequent to a laser scribe and plasma etch singulation process of a substrate or wafer. In an embodiment, a metrology station is also included as a component of process tool 600.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 600 described in association with FIG. 6. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
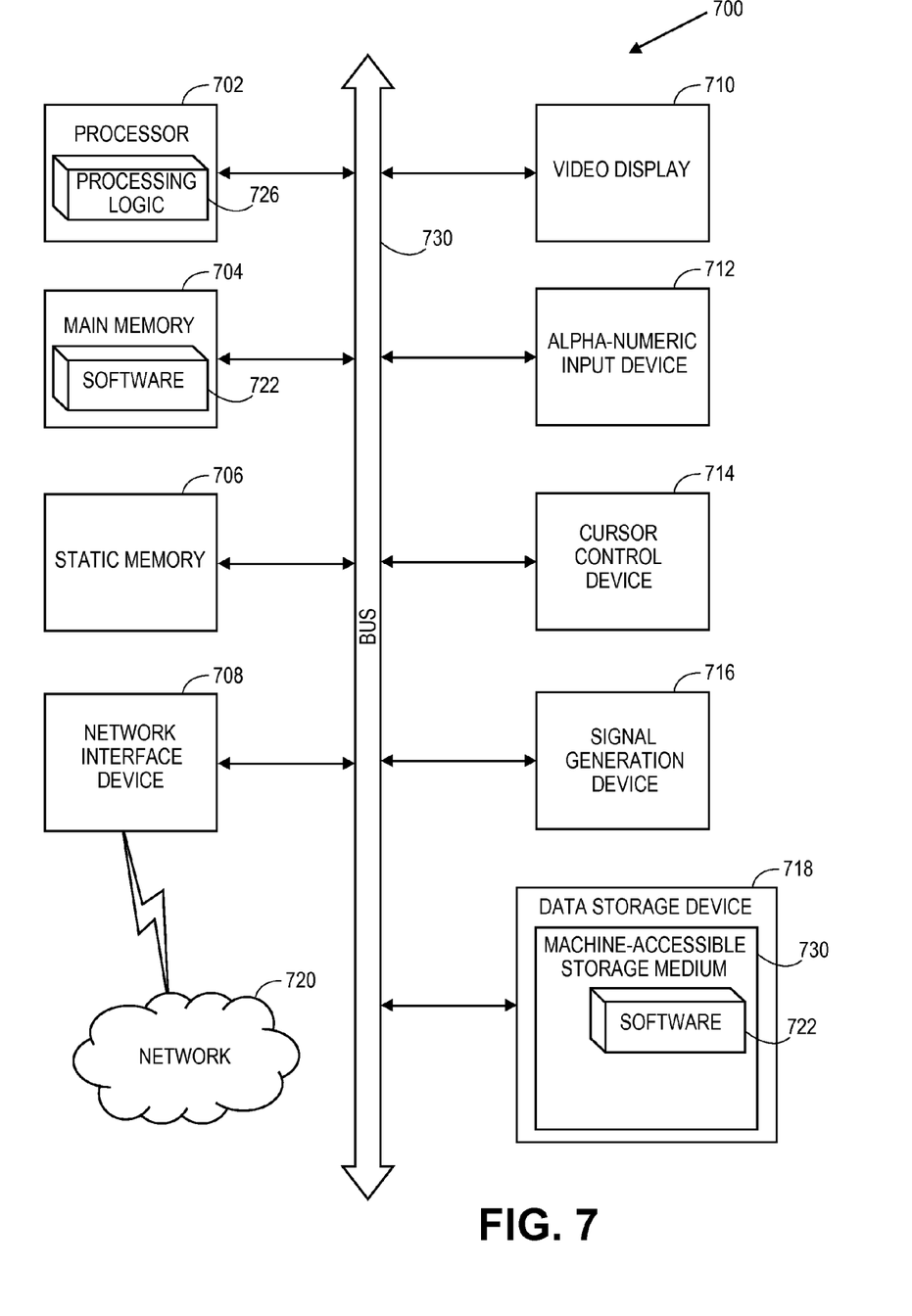
FIG. 7 illustrates a block diagram of an exemplary computer system, in accordance with an embodiment of the present invention.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 731 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform an above described method of dicing a semiconductor wafer having a plurality of integrated circuits.

Thus, methods of dicing semiconductor wafers, each wafer having a plurality of integrated circuits, have been disclosed. In accordance with an embodiment of the present invention, a method includes applying a protection tape to a wafer front side, the wafer having a dicing tape attached to the wafer backside. The dicing tape is removed from the wafer backside to expose a die attach film disposed between the wafer backside and the dicing tape. Alternatively, if no die attach film is initially disposed between the wafer backside and the dicing tape, a die attach film is applied to the wafer backside at this operation. A water soluble mask is applied to the wafer backside. A laser scribe is performed on the wafer backside to cut through the die attach film and the wafer, including all layers on the front side and backside of the wafer. A plasma etch is performed to treat or clean surfaces of the wafer exposed by the laser scribe. A wafer backside cleaning is performed and a second dicing tape is applied to the wafer backside. The protection tape is the removed from the wafer front side. In one embodiment, the wafer backside includes backside metallization and dielectric layers, and the wafer front side include device layers.

What is claimed is:

1. A method of dicing a semiconductor wafer comprising a plurality of integrated circuits, the method comprising:

applying a protection tape to a wafer front side, the wafer having a dicing tape attached to the wafer backside;

removing the dicing tape from the wafer backside to expose a die attach film disposed between the wafer backside and the dicing tape; and, subsequently, applying a mask to the wafer backside; and, subsequently, laser scribing from the wafer backside to cut through the mask, the die attach film and the wafer, including all layers within the front side and backside of the wafer;

plasma etching to treat or clean surfaces of the wafer exposed by the laser scribing; and, subsequently, cleaning the wafer backside and applying a second dicing tape to the wafer backside; and, subsequently, removing the protection tape from the wafer front side.

2. The method of claim 1, wherein applying the mask to the wafer backside comprises applying a water soluble mask to the wafer backside.

3. The method of claim 1, wherein laser scribing from the wafer backside comprises using a femtosecond-based laser scribing process.

4. The method of claim 1, wherein laser scribing from the wafer backside comprises using a picosecond-based laser scribing process.

5. The method of claim 1, wherein the wafer backside includes backside metallization and dielectric layers, and the wafer front side includes device layers.

6. The method of claim 1, wherein the wafer is a monocrystalline silicon substrate.

7. The method of claim 2, wherein cleaning the wafer backside comprises removing the water soluble mask with an aqueous solution.

8. A method of dicing a semiconductor wafer comprising a plurality of integrated circuits, the method comprising:

applying a protection tape to a wafer front side, the wafer having a dicing tape attached to the wafer backside;

removing the dicing tape from the wafer backside; and, subsequently, applying a die attach film to the wafer backside; and, subsequently, applying a mask to the wafer backside; and, subsequently, laser scribing from the wafer backside to cut through the mask, the die attach film and the wafer, including all layers included within the front side and backside of the wafer;

plasma etching to treat or clean surfaces of the wafer exposed by the laser scribing; and, subsequently, cleaning the wafer backside and applying a second dicing tape to the wafer backside; and, subsequently, removing the protection tape from the wafer front side.

9. The method of claim 8, wherein applying the mask to the wafer backside comprises applying a water soluble mask to the wafer backside.

10. The method of claim 8, wherein laser scribing from the wafer backside comprises using a femtosecond-based laser scribing process.

11. The method of claim 8, wherein laser scribing from the wafer backside comprises using a picosecond-based laser scribing process.

12. The method of claim 8, wherein the wafer backside includes backside metallization and dielectric layers, and the wafer front side include device layers.

13. The method of claim 8, wherein the wafer is a monocrystalline silicon substrate.

14. The method of claim 9, wherein cleaning the wafer backside comprises removing the water soluble mask with an aqueous solution.

15. A method of dicing a semiconductor wafer comprising a plurality of integrated circuits covered by a protection tape on a front side thereof and comprising metallization on a backside thereof, the method comprising:

exposing a die attach film disposed on the semiconductor wafer backside;

applying a mask to the exposed die attach film on the semiconductor wafer backside;

laser scribing from the semiconductor wafer backside to cut through the mask, the die attach film, the metallization on the backside of the semiconductor wafer, the semiconductor wafer, and the integrated circuits on the front side of the semiconductor wafer;

plasma etching to treat or clean surfaces of the semiconductor wafer exposed by the laser scribing; and applying a dicing tape to the laser scribed semiconductor wafer backside.

16. The method of claim 15, wherein applying the mask to the semiconductor wafer backside comprises applying a water soluble mask to the semiconductor wafer backside.

17. The method of claim 15, wherein laser scribing from the semiconductor wafer backside comprises using a femtosecond-based laser scribing process.

18. The method of claim 15, wherein laser scribing from the semiconductor wafer backside comprises using a picosecond-based laser scribing process.

19. The method of claim 15, wherein the wafer is a monocrystalline silicon substrate.

20. The method of claim 16, further comprising:

subsequent to the laser scribing and prior to applying the second dicing tape, cleaning the semiconductor wafer backside by removing the water soluble mask with an aqueous solution.

* * * * *